(12) United States Patent
Motoyama et al.

(10) Patent No.: US 11,807,938 B2
(45) Date of Patent: Nov. 7, 2023

(54) EXHAUST DEVICE, PROCESSING SYSTEM, AND PROCESSING METHOD

(71) Applicant: Tokyo Electron Limited, Tokyo (JP)

(72) Inventors: Yutaka Motoyama, Yamanashi (JP); Rui Kanemura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 110 days.

(21) Appl. No.: 16/775,439

(22) Filed: Jan. 29, 2020

(65) Prior Publication Data

US 2020/0248305 A1 Aug. 6, 2020

(30) Foreign Application Priority Data

Feb. 4, 2019 (JP) .................. 2019-018227

(51) Int. Cl.
*C23C 16/44* (2006.01)
*C23C 16/455* (2006.01)
*C23C 16/52* (2006.01)

(52) U.S. Cl.
CPC .... *C23C 16/4412* (2013.01); *C23C 16/45544* (2013.01); *C23C 16/52* (2013.01)

(58) Field of Classification Search
CPC .......... C23C 16/4412; C23C 16/45544; C23C 16/52; C23C 16/45546; C23C 16/54; C23C 16/0236; C23C 16/56; C23C 14/564; B05C 9/00; H01L 21/67253; H01L 21/67017
USPC ........................................................ 118/715
See application file for complete search history.

(56) References Cited

U.S. PATENT DOCUMENTS

| | | | | |
|---|---|---|---|---|
| 5,534,069 A | * | 7/1996 | Kuwabara | B01D 53/72 118/715 |
| 5,685,912 A | * | 11/1997 | Nishizaka | C23C 16/4412 118/715 |
| 5,948,169 A | * | 9/1999 | Wu | C23C 16/52 118/723 FI |
| 6,139,642 A | * | 10/2000 | Shimahara | C23C 16/4408 118/724 |
| 9,353,438 B2 | * | 5/2016 | Sano | C23C 16/54 |
| 9,725,805 B2 | * | 8/2017 | Kobrin | B82Y 30/00 |
| 11,203,488 B2 | * | 12/2021 | Hayashi | H01L 21/67265 |
| 11,222,796 B2 | * | 1/2022 | Saido | C23C 16/4584 |
| 11,236,743 B2 | * | 2/2022 | Okuno | F04B 49/065 |
| 11,261,528 B2 | * | 3/2022 | Hiramatsu | C23C 16/45578 |
| 11,293,096 B2 | * | 4/2022 | Morikawa | C23C 16/4486 |
| 11,300,456 B2 | * | 4/2022 | Osaka | G01K 7/02 |
| 2008/0267598 A1 | * | 10/2008 | Nakamura | H01L 21/67306 392/416 |

(Continued)

FOREIGN PATENT DOCUMENTS

| CN | 2921039 Y | * | 7/2007 |
|---|---|---|---|
| CN | 2921039 Y | | 7/2007 |

(Continued)

*Primary Examiner* — Jeffrie R Lund
(74) *Attorney, Agent, or Firm* — Venjuris, P.C.

(57) ABSTRACT

An exhaust device includes: a first pressure regulator provided in an exhaust pipe connected to a processing container; a second pressure regulator provided on a downstream side of the first pressure regulator; a first vacuum gauge provided on an upstream side of the first pressure regulator; and a second vacuum gauge provided between the first pressure regulator and the second pressure regulator.

7 Claims, 6 Drawing Sheets

(56) References Cited

U.S. PATENT DOCUMENTS

| | | | | |
|---|---|---|---|---|
| 2009/0266088 A1* | 10/2009 | Oikawa | ................... | B01D 8/00 |
| | | | | 62/55.5 |
| 2011/0087378 A1* | 4/2011 | Kim | ..................... | C23C 14/564 |
| | | | | 700/282 |
| 2011/0130011 A1* | 6/2011 | Sasajima | .......... | H01L 21/02244 |
| | | | | 438/770 |
| 2013/0102161 A1* | 4/2013 | Asai | ................... | C23C 16/4405 |
| | | | | 438/791 |
| 2014/0345658 A1* | 11/2014 | Maruyama | ........ | H01L 21/67051 |
| | | | | 134/56 R |
| 2015/0200081 A1* | 7/2015 | Nakayama | ........ | H01L 21/68742 |
| | | | | 134/1.1 |
| 2015/0228474 A1* | 8/2015 | Hanashima | ....... | H01L 21/02167 |
| | | | | 438/778 |
| 2015/0376781 A1* | 12/2015 | Kogura | ............ | H01L 21/02126 |
| | | | | 438/758 |
| 2016/0002789 A1* | 1/2016 | Kontani | ............. | C23C 16/4412 |
| | | | | 438/778 |
| 2016/0245704 A1* | 8/2016 | Osaka | ...................... | G01K 1/14 |
| 2017/0170004 A1* | 6/2017 | Harada | ................ | C23C 16/402 |
| 2017/0275757 A1* | 9/2017 | Kikuchi | ............ | C23C 16/45557 |
| 2018/0044794 A1* | 2/2018 | Yamaguchi | ....... | C23C 16/45546 |
| 2018/0187307 A1* | 7/2018 | Yoshida | ................ | C23C 16/345 |
| 2018/0283914 A1* | 10/2018 | Sugita | ...................... | G01F 1/50 |
| 2018/0347047 A1* | 12/2018 | Hashimoto | ....... | H01L 21/02164 |
| 2019/0212176 A1* | 7/2019 | Miyoshi | .................... | G01F 3/36 |
| 2019/0218666 A1* | 7/2019 | Harada | ................. | C23C 16/455 |
| 2019/0287830 A1* | 9/2019 | Saido | .................. | C23C 16/4412 |
| 2020/0216958 A1* | 7/2020 | Saido | .................. | C23C 16/4584 |
| 2020/0219745 A1* | 7/2020 | Okazaki | ............ | H01L 21/67781 |
| 2020/0248305 A1* | 8/2020 | Motoyama | ........ | C23C 16/45544 |
| 2020/0402788 A1* | 12/2020 | Hashimoto | ....... | H01L 21/02126 |
| 2021/0040609 A1* | 2/2021 | Harada | ............. | C23C 16/45531 |
| 2021/0043485 A1* | 2/2021 | Saido | ............... | C23C 16/45574 |
| 2021/0098258 A1* | 4/2021 | Degai | .................... | C23C 16/02 |
| 2022/0136497 A1* | 5/2022 | Okuno | ............... | G05B 23/0286 |
| | | | | 417/44.2 |
| 2022/0143655 A1* | 5/2022 | Dobashi | ............ | H01L 21/67028 |
| 2022/0145464 A1* | 5/2022 | Hiramatsu | ............ | H01L 21/205 |

FOREIGN PATENT DOCUMENTS

| | | | |
|---|---|---|---|
| CN | 102865951 A | * | 1/2013 |
| CN | 103453883 A | * | 12/2013 |
| CN | 106368777 A | * | 2/2017 |
| DE | 10138799 A1 | * | 3/2003 |
| JP | H06201501 A | * | 7/1994 |
| JP | 2003-218098 A | | 7/2003 |
| JP | 2011-100786 A | | 5/2011 |
| JP | 2014-027191 A | | 2/2014 |
| JP | 2014149065 A | * | 8/2014 |
| KR | 10-2011-0049710 A | | 5/2011 |
| KR | 10-2013-0011925 A | | 1/2013 |
| KR | 10-2018-0120586 A | | 11/2018 |
| WO | WO-2004113860 A1 | * | 12/2004 |

\* cited by examiner

EXHAUST DEVICE, PROCESSING SYSTEM, AND PROCESSING METHOD

CROSS-REFERENCE TO RELATED APPLICATIONS

This application is based on and claims priority from Japanese Patent Application No. 2019-018227 filed on Feb. 4, 2019 with the Japan Patent Office, the disclosure of which is incorporated herein in its entirety by reference.

TECHNICAL FIELD

The present disclosure relates to an exhaust device, a processing system, and a processing method.

BACKGROUND

In a manufacturing process of a semiconductor device, a processing apparatus is used in which a semiconductor wafer is accommodated in a processing container to which a gas supply system and a vacuum exhaust system are connected and a predetermined processing is performed (see, e.g., Japanese Patent Laid-Open Publication No. 2003-218098). However, when a processing is performed using a plurality of processing apparatuses having the same specifications, if there is a deviation in an exhaust performance among the plurality of processing apparatuses, there is a possibility that the processing results may be different for each processing apparatus.

SUMMARY

An exhaust device according to an aspect of the present disclosure includes: a first pressure regulator provided in an exhaust pipe connected to a processing container; a second pressure regulator provided on a downstream side of the first pressure regulator; a first vacuum gauge provided on an upstream side of the first pressure regulator; and a second vacuum gauge provided between the first pressure regulator and the second pressure regulator.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

[Processing System]

Figure 1:
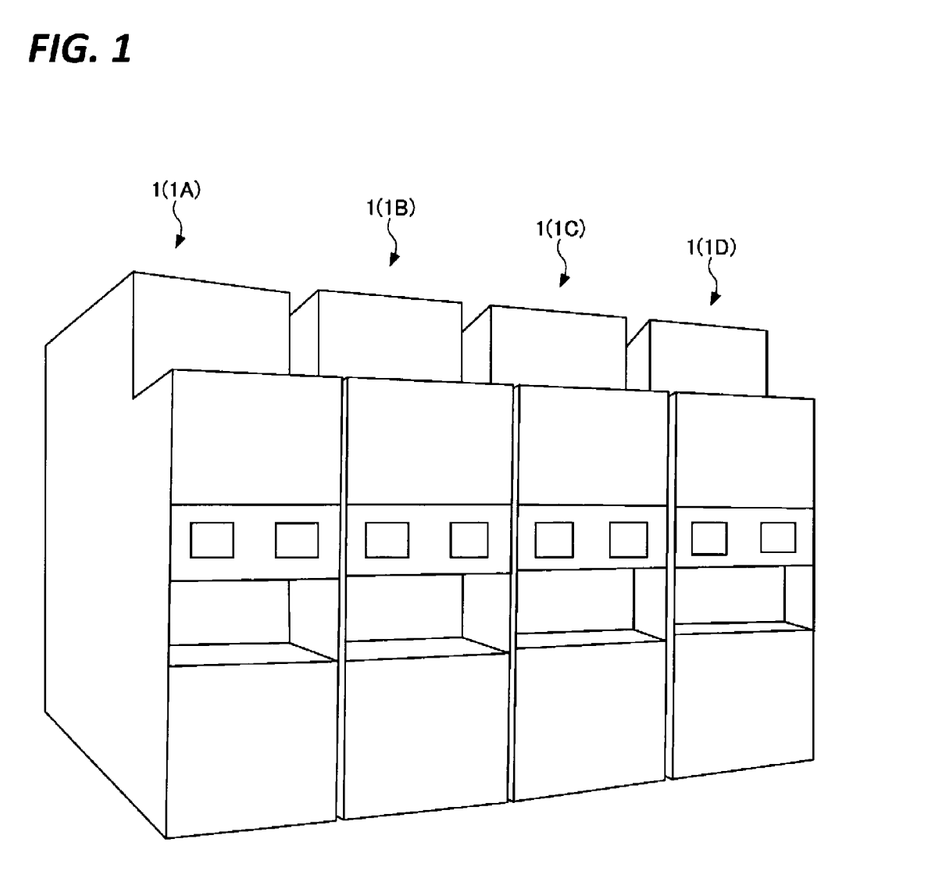
FIG. 1 is a view illustrating an exemplary configuration of a processing system of an exemplary embodiment.

A processing system of an embodiment will be described with reference to FIG. 1. FIG. 1 is a view illustrating an exemplary configuration of a processing system of an exemplary embodiment.

As illustrated in FIG. 1, the processing system of the embodiment includes a plurality of processing apparatuses 1 (1A, 1B, 1C, and 1D) having a same specification. The processing apparatuses 1A, 1B, 1C, and 1D are devices that collectively perform a processing on a plurality of substrates, for example, in each of processing containers. The processing apparatuses 1A, 1B, 1C, and 1D may be devices that, for example, accommodate substrates one by one in the processing container and perform the processing. Hereinafter, each of the processing apparatuses 1A, 1B, 1C, and 1D is also referred to as a "processing apparatus 1."

[Processing Apparatus]

Figure 2:
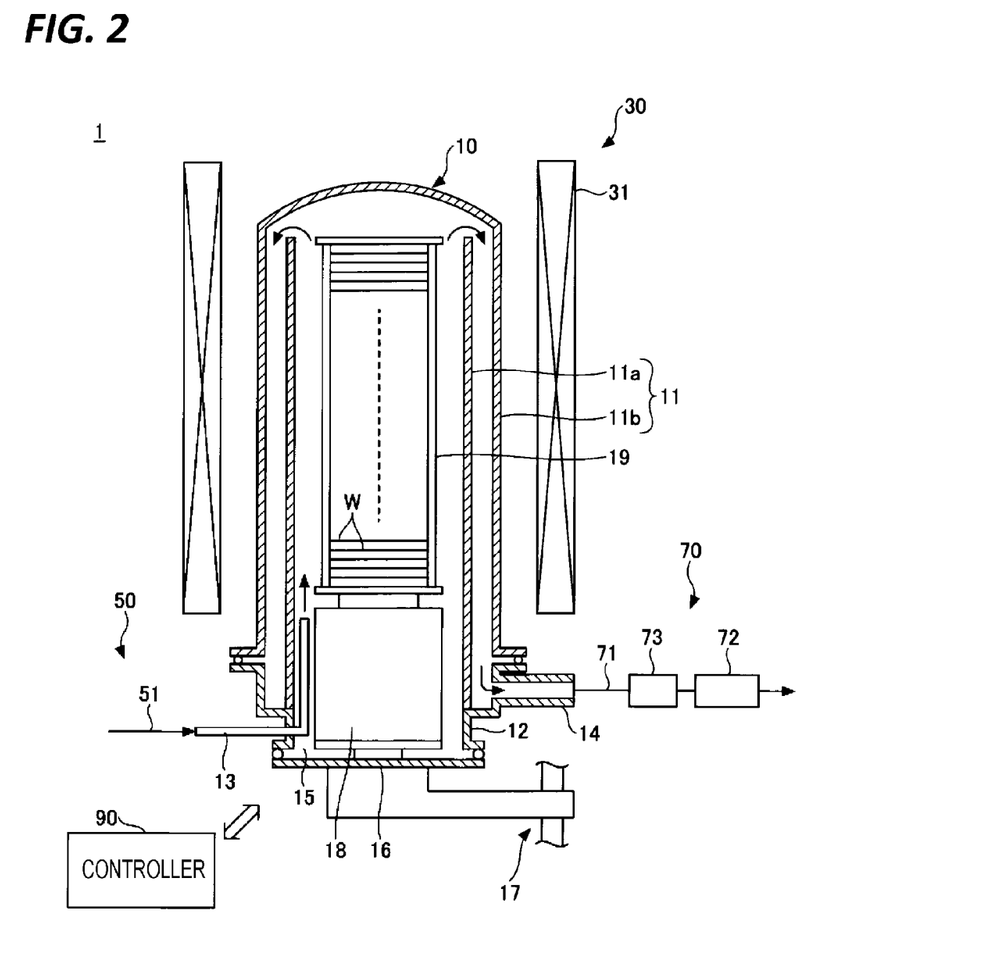
FIG. 2 is a view illustrating an exemplary configuration of a processing apparatus of an exemplary embodiment.

An exemplary configuration of the processing apparatus 1 included in the processing system in FIG. 1 will be described with reference to FIG. 2. FIG. 2 is a view illustrating an exemplary configuration of the processing apparatus 1 of an exemplary embodiment. As illustrated in FIG. 2, the processing apparatus 1 includes a processor 10, a heating unit 30, a gas introducing unit 50, an exhaust unit 70, and a controller 90.

The processor 10 performs predetermined processings such as a film forming processing, an etching processing on a semiconductor wafer (hereinafter, simply referred to as a "wafer W") that is an example of a substrate. The processor 10 includes, for example, a processing container 11, a manifold 12, an injector 13, and an exhaust port 14.

The processing container 11 has a vertically long shape extending in the vertical direction. The processing container 11 is made of, for example, a heat resistant material such as quartz or silicon carbide. The processing container 11 has a dual tube structure including an inner tube 11a of a cylindrical body and an outer tube 11b having a ceiling, which is placed coaxially outside the inner tube 11a. The processing container 11 may have a single tube structure.

The manifold 12 is fixed to, for example, a base plate (not illustrated). The manifold 12 is made of, for example, stainless steel, and holds a lower end of the processing container 11 in an airtight manner.

The injector 13 is attached to the manifold 12. The injector 13 is, for example, a quartz pipe bent in an L shape, and introduces various gases into the processing container 11. The various gases include, for example, a processing gas such as a film forming gas and an etching gas, or a purge gas. The film forming gas is a gas used when forming a film on the wafer W accommodated in the processing container 11. The type of the film forming gas is not particularly limited, but examples thereof may include, for example, a metal-containing gas, a semiconductor gas, an oxidizing gas, and a reducing gas. The etching gas is a gas used when etching the wafer W accommodated in the processing container 11 or a film formed on the wafer W. The type of the etching gas is not particularly limited, but examples thereof may include, for example, a halogen-containing gas. The purge gas is a gas used when purging the inside of the processing container 11. The type of the purge gas is not particularly limited, but examples thereof may include, for example, an inert gas.

The exhaust port 14 is formed in the manifold 12, and exhausts the gas in the processing container 11.

A furnace opening 15 is formed at a lower end of the manifold 12. The furnace opening 15 is provided with a disc-shaped lid 16 made of, for example, stainless steel. The lid 16 is provided to be elevatable by an elevating mechanism 17, and hermetically seals the furnace opening 15. For example, a heat insulating cylinder 18 made of quartz is provided on the lid 16. For example, a wafer boat 19 made of quartz, that holds a plurality of wafers W in a horizontal state with a predetermined interval in multiple stages, is placed on the heat insulating cylinder 18.

The wafer boat 19 is carried into the processing container 11 by raising the lid 16 using the elevating mechanism 17, and is accommodated in the processing container 11. Further, the wafer boat 19 is carried out from the processing container 11 by lowering the lid 16. The wafer boat 19 has a plurality of slots (support grooves) in the longitudinal direction, and the wafers W are loaded in the slots at intervals vertically in the horizontal state, respectively. The plurality of wafers W placed on the wafer boat 19 constitutes one batch, and various processings are performed by one batch.

The heating unit 30 heats the wafer W in the processing container 11 to a predetermined temperature. The heating unit 30 includes a heater 31. The heater 31 is provided around the processing container 11, and has, for example, a cylindrical shape. The heater 31 may be, for example, a resistant heat-generating element.

The gas introducing unit 50 introduces various gases to the injector 13. The gas introducing unit 50 includes a supply pipe 51, a flow rate controller (not illustrated), an opening/closing valve (not illustrated), and the like. The supply pipe 51 connects various gas supply sources (not illustrated) and the injector 13 with each other, and introduces gas to the injector 13 from the various gas supply sources. The flow rate controller is provided in the middle of the supply pipe 51, and controls the flow rate of the gas flowing through the supply pipe 51. The flow rate controller may be, for example, a mass flow controller. The opening/closing valve is provided in the middle of the supply pipe 51, and controls the supply/block of the gas flowing through the supply pipe 51 to the injector 13.

The exhaust unit 70 exhausts the inside of the processing container 11 via the exhaust port 14. The exhaust unit 70 includes an exhaust pipe 71, an exhaust device 72, an exhaust box 73, and the like. The exhaust pipe 71 connects the exhaust port 14 and the exhaust device 72 with each other. The exhaust device 72 includes, for example, a vacuum pump such as a dry pump or a turbo molecular pump, and exhausts the inside of the processing container 11 via the exhaust pipe 71. The exhaust box 73 is provided in the middle of the exhaust pipe 71, and includes a vacuum valve, a vacuum gauge, and the like.

Figure 3:
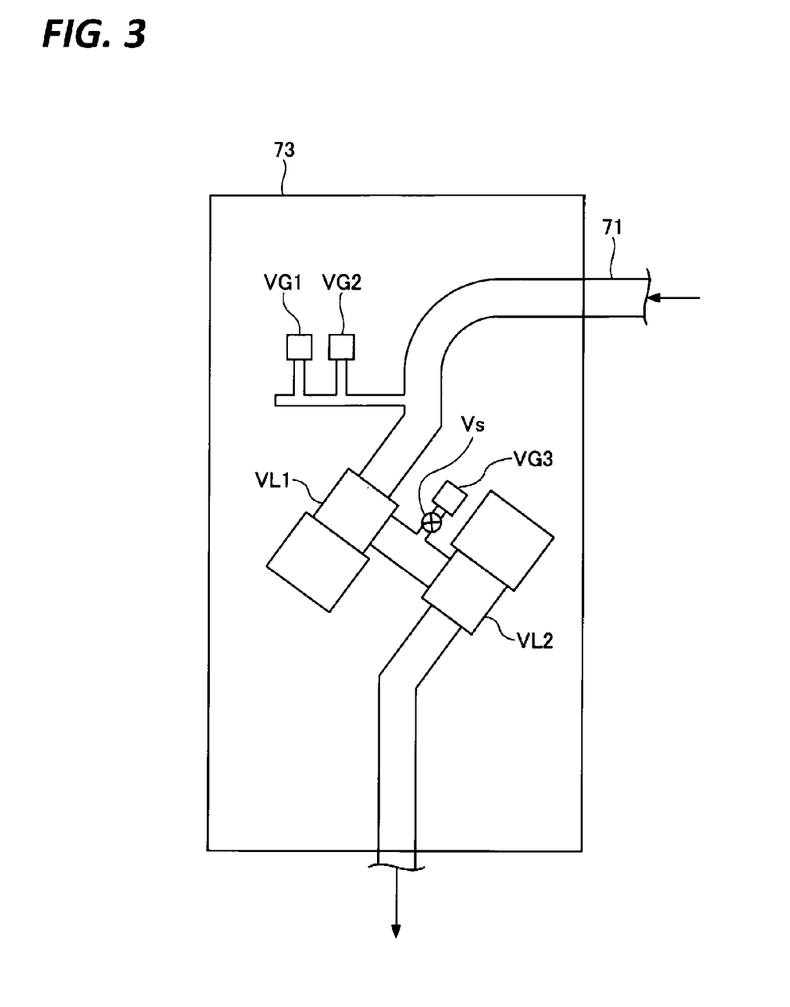
FIG. 3 is a view illustrating an example of an exhaust box.

FIG. 3 is a view illustrating an example of the exhaust box 73 of the processing apparatus 1. As illustrated in FIG. 3, the exhaust box 73 includes primary side vacuum gauges VG1 and VG2, an upstream side vacuum valve VL1, a secondary vacuum gauge VG3, and a downstream side vacuum valve VL2 that are provided in the middle of the exhaust pipe 71 in order from the upstream side (processing container 11 side).

The primary side vacuum gauges VG1 and VG2 are provided on the upstream side of the upstream side vacuum valve VL1 in the exhaust pipe 71, and detect a pressure of an upstream side portion of the upstream side vacuum valve VL1 in the exhaust pipe 71. The upstream side portion of the upstream side vacuum valve VL1 in the exhaust pipe 71 communicates with the inside of the processing container 11 via the exhaust port 14, and has substantially the same pressure as the pressure inside the processing container 11. Therefore, the primary side vacuum gauges VG1 and VG2 detect the pressure inside the processing container 11 by detecting the pressure inside the exhaust pipe 71. The primary side vacuum gauges VG1 and VG2 detect the pressure inside the processing container 11 when a predetermined processing is performed in the processing container 11, and output the detected values to the controller 90. Types of the primary side vacuum gauges VG1 and VG2 are not particularly limited, but may be, for example, a diaphragm vacuum gauge. The primary side vacuum gauge VG1 is a vacuum gauge configured to detect, for example, a pressure of 10 Torr ($1.3 \times 10^3$ Pa) or less. The primary side vacuum gauge VG2 is a vacuum gauge configured to detect, for example, a pressure in a range of 10 Torr ($1.3 \times 10^3$ Pa) to 1000 Torr ($1.3 \times 10^5$ Pa). The primary side vacuum gauges VG1 and VG2 may be constituted by one vacuum gauge.

The upstream side vacuum valve VL1 is provided on the downstream side of the primary side vacuum gauges VG1 and VG2 in the exhaust pipe 71, and regulates the conductance of the exhaust pipe 71, so as to control the flow rate of the gas flowing through the exhaust pipe 71. A type of the upstream side vacuum valve VL1 is not particularly limited, but may be, for example, a butterfly valve. The upstream side vacuum valve VL1 regulates the conductance of the exhaust pipe 71 according to a control command from the controller 90.

The secondary side vacuum gauge VG3 is provided between the upstream side vacuum valve VL1 and the downstream side vacuum valve VL2 in the exhaust pipe 71, and detects a pressure of a portion between the upstream side vacuum valve VL1 and the downstream side vacuum valve VL2 in the exhaust pipe 71. The secondary side vacuum gauge VG3 is connected to the exhaust pipe 71 via, for example, the isolation valve Vs, and detects the pressure of the exhaust pipe 71 when the isolation valve Vs is opened, and outputs the detected value to the controller 90. The isolation valve Vs may not be provided. A type of the secondary side vacuum gauge VG3 is not particularly limited, but may be, for example, a diaphragm vacuum gauge. For example, similarly to the primary side vacuum gauge VG1, the secondary side vacuum gauge VG3 is a vacuum gauge configured to detect a pressure of 10 Torr ($1.3 \times 10^3$ Pa) or less.

The downstream side vacuum valve VL2 is provided on the downstream side of the secondary side vacuum gauge VG3 in the exhaust pipe 71, and regulates the conductance of the exhaust pipe 71, so as to control the flow rate of the gas flowing through the exhaust pipe 71. A type of the downstream side vacuum valve VL2 is not particularly limited, but may be, for example, a butterfly valve. The downstream side vacuum valve VL2 regulates the conductance of the exhaust pipe 71 according to a control command from the controller 90.

The controller 90 controls an operation of each component of the processing apparatus 1. The controller 90 may be, for example, a computer. A computer program that controls the operation of each component of the processing apparatus 1 is stored in a medium, is read into a storage unit by a predetermined reading device, and is installed in the controller 90. The medium may be, for example, a hard disk, a compact disk, a magneto-optical disk, a memory card, and a flexible disk.

For example, before performing a predetermined processing in the processing container 11, the controller 90 regulates an opening degree of the downstream side vacuum valve VL2 such that the pressure detected the secondary side vacuum gauge VG3 becomes a predetermined set value. Specifically, when the pressure detected by the secondary vacuum gauge VG3 is larger than a predetermined set value, the controller 90 increases the opening degree of the downstream side vacuum valve VL2 such that the conductance of the downstream side vacuum valve VL2 is increased. Therefore, even when the exhaust performance of the exhaust device 72 deteriorates with time, it is possible to maintain the conductance of the exhaust unit 70 substantially constant. At this time, the controller 90 may maintain the temperature in the processing container 11 constant, and regulate the downstream side vacuum valve VL2 in a state where an inert gas is supplied into the processing container 11. The set value is set, for example, immediately after changing the exhaust device 72 or immediately after performing maintenance of the exhaust device 72. Further, the set value may be a value common among the processing apparatuses 1 of the same specification. Therefore, it is possible to regulate the conductance of the exhaust unit 70 substantially the same among the processing apparatuses 1 of the same specification, and thus, it is possible to reduce the machine difference among the processing apparatuses 1.

Further, when performing a film forming processing in the processing container 11, the controller 90 controls the isolation valve Vs to be closed. Therefore, since the communication between the exhaust pipe 71 and the secondary side vacuum gauge VG3 is blocked, it is possible to prevent a reaction product or the like generated during the film forming processing from adhering to the secondary side vacuum gauge VG3. As a result, it is possible to suppress a zero point of the secondary side vacuum gauge VG3 from being shifted.

Further, when the inside of the processing container 11 is controlled to be equal to or higher than a predetermined pressure, the controller 90 reduces the opening degree of the downstream side vacuum valve VL2 such that the conductance of the downstream side vacuum valve VL2 is reduced, and then regulates the upstream side vacuum valve VL1 such that the inside of the processing container 11 becomes a desired pressure. Therefore, it is possible to suppress the accuracy of pressure control from being decreased due to the opening degree that becomes too small during pressure control by the upstream side vacuum valve VL1. A predetermined pressure is determined, for example, in accordance with a pressure range in which the upstream side vacuum valve VL1 is usable.

As described above, in the embodiment, the primary side vacuum gauges VG1 and VG2, the upstream side vacuum valve VL1, the secondary side vacuum gauge VG3, and the downstream side vacuum valve VL2 are provided in this order in the exhaust pipe 71 connected to the processing container 11. Therefore, among the plurality of processing apparatuses 1 of the same specification, the downstream side vacuum valve VL2 may be regulated such that the pressure detected by the secondary side vacuum gauge VG3 becomes a predetermined common set value. As a result, it is possible to regulate the conductance of the exhaust unit 70 substantially the same among the plurality of processing apparatuses 1 of the same specification, and thus, it is possible to reduce the machine difference among the processing apparatuses 1.

However, in an atomic layer deposition (ALD) process, supplying of a first reactive gas, exhausting of the first reactive gas, supplying of a second reactive gas, and exhausting of the second reactive gas are repeated in a short cycle. Therefore, due to the problem of the responsiveness of the vacuum valve, there is a case where opening degree control or full opening is used, instead of using pressure control. In this case, the pressure in the processing container 11 depends on the exhaust performance of the exhaust unit 70. Therefore, when the exhaust performance of the exhaust unit 70 among the processing apparatuses 1, a deviation in the pressure in the processing container 11 among the processing apparatuses 1 occurs, and thus, a deviation in thickness or quality of the film formed on the wafer W occurs.

However, in the embodiment, it is possible to regulate the conductance of the exhaust unit 70 substantially the same among the plurality of processing apparatuses 1 of the same specification. Therefore, even when using the opening degree control or the full opening in the ALD process, it is possible to suppress a deviation in the pressure in the processing container 11 among the processing apparatuses 1 from occurring. As a result, the deviation in the thickness or the quality of the film formed on the wafer W may be reduced.

[Operation of Processing Apparatus]

Figure 4:
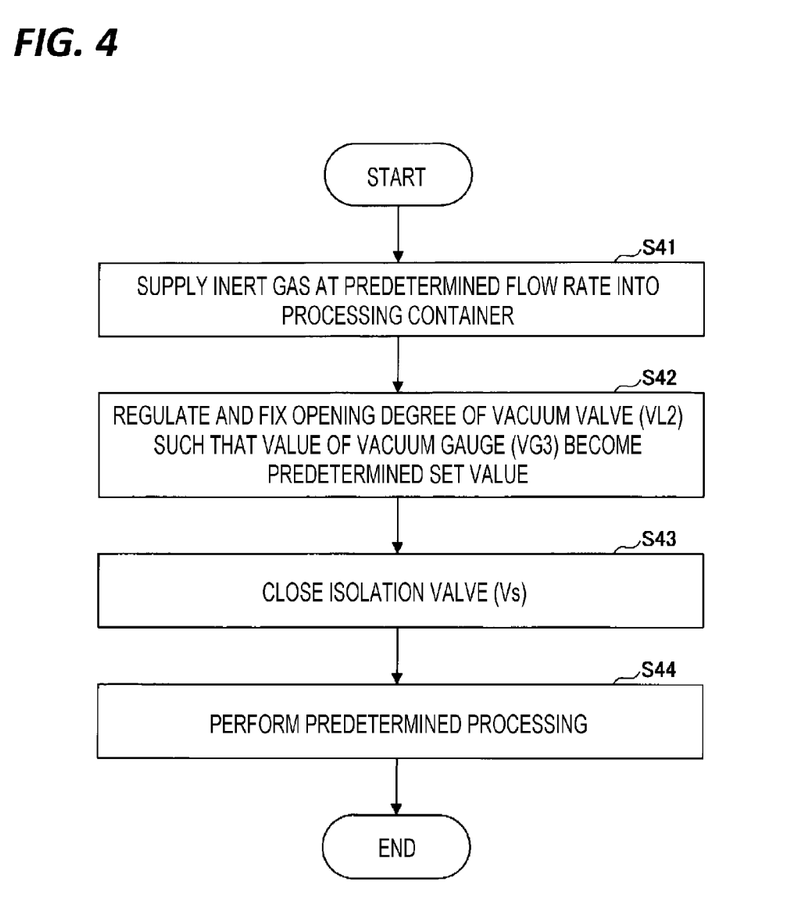
FIG. 4 is a view illustrating an example of a flow of a conductance regulating processing.

As an example of an operation (processing method) of the processing apparatus 1, a processing (hereinafter, referred to as a "conductance regulating processing") for regulating the conductance of the exhaust unit 70 by controlling an operation of each component of the processing apparatus 1 by the controller 90 will be described with reference to FIG. 4. The conductance regulating processing is executed when the controller 90 receives a signal for executing a predetermined processing such as a film forming processing or an etching processing. FIG. 4 is a view illustrating an example of a flow of the conductance regulating processing.

In step S41, the controller 90 controls the gas introducing unit 50 so as to supply an inert gas at a predetermined flow rate into the processing container 11. Further, the controller 90 controls the heating unit 30 such that the inside of the processing container 11 is maintained at a constant temperature.

In step S42, the controller 90 regulates the opening degree of the downstream side vacuum valve VL2 such that the pressure detected by the secondary side vacuum gauge VG3 becomes a predetermined set value. Then, the opening degree is fixed after being regulated.

In step S43, the controller 90 closes the isolation valve Vs.

In step S44, the controller 90 causes a predetermined processing to be started by controlling the operation of each component of the processing apparatus 1. After the predetermined processing is ended, the controller 90 causes the conductance regulating processing to be ended.

In the above conductance regulating processing, the controller 90 controls the opening degree of the downstream side vacuum valve VL2 such that the pressure detected by the secondary side vacuum gauge VG3 becomes a predetermined set value, for each predetermined processing. Therefore, since the conductance of the exhaust unit 70 may be regulated to be substantially the same for each predetermined processing, even when the exhaust performance of the exhaust device 72 deteriorates with time, it is possible to maintain the conductance of the exhaust unit 70 substantially constant. Therefore, even when using the opening degree control or the full opening in the ALD process, it is possible to suppress a deviation in the pressure in the processing container 11 among the batches from occurring. As a result, the deviation in the thickness or the quality of the film formed on the wafer W among the batches may be suppressed from occurring.

Further, by performing the conductance regulating processing described above by the plurality of processing apparatuses 1 of the same specification, it is possible to regulate the conductance of the exhaust unit 70 substantially the same among the plurality of processing apparatuses 1 of the same specification, and thus, it is possible to reduce the machine difference among the processing apparatuses 1.

Figure 5:
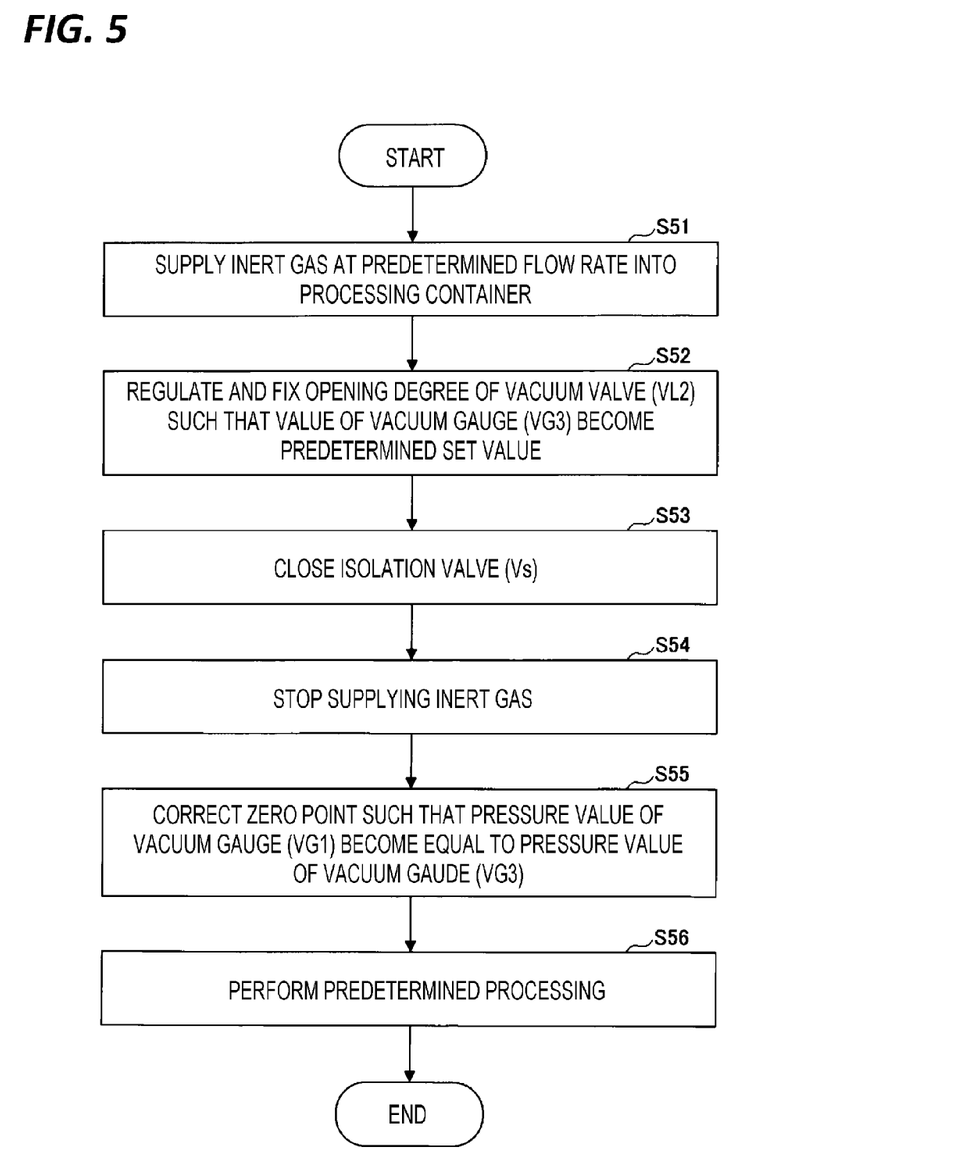
FIG. 5 is a view illustrating an example of a flow of a zero point correcting processing.

As an example of an operation (processing method) of the processing apparatus 1, a processing (hereinafter, referred to as a "zero point correcting processing") for correcting the zero point of the primary side vacuum gauge VG1 by controlling the operation of each component of the processing apparatus 1 by the controller 90 will be described with reference to FIG. 5. The zero point correcting processing is executed when the controller 90 receives the signal for executing a predetermined processing such as a film forming processing or an etching processing. FIG. 5 is a view illustrating an example of a flow of the zero point correcting processing.

Since steps S51 to S53 are equal to steps S41 to S43 of the conductance regulating processing, descriptions thereof will be omitted.

In step S54, the gas introducing unit 50 is controlled so as to stop the supply of the inert gas into the processing container 11.

In step S55, the controller 90 corrects the zero point of the primary side vacuum gauge VG1 such that the pressure value of the primary side vacuum gauge VG1 becomes equal to the pressure value of the secondary side vacuum gauge VG3. The correcting of the zero point may be executed by an operator.

In step S56, the controller 90 causes a predetermined processing to be started by controlling the operation of each component of the processing apparatus 1. After the predetermined processing is ended, the controller 90 causes the zero point correcting processing to be ended.

In the above zero point correcting processing, for each processing, the zero point of the primary side vacuum gauge VG1 is corrected such that the pressure value of the primary side vacuum gauge VG1 becomes equal to the pressure value of the secondary side vacuum gauge VG3. Therefore, for example, even when a film is adhered to the primary side vacuum gauge VG1 by the film forming processing, the pressure in the processing container 11 may be regulated with a good accuracy. As a result, it is possible to obtain stable process performance.

However, a case where the zero point of the primary side vacuum gauge VG1 is shifted by 5 mTorr, for example, in a film forming step of 0.2 Torr is considered. In this case, originally, the film formation is performed in a state where the inside of the processing container 11 is regulated to 0.2 Torr, and thus, the film formation is performed in a state of being regulated to 0.195 Torr or 0.205 Torr. Therefore, the thickness of the formed film is deviated from the designed film thickness. Particularly, in a process in which the film forming step and the etching step are alternately repeated, the deviation from the designed film thickness deteriorates the in-plane uniformity of the film thickness. However, the above problem may be solved in the zero point correcting processing described above.

Figure 6:
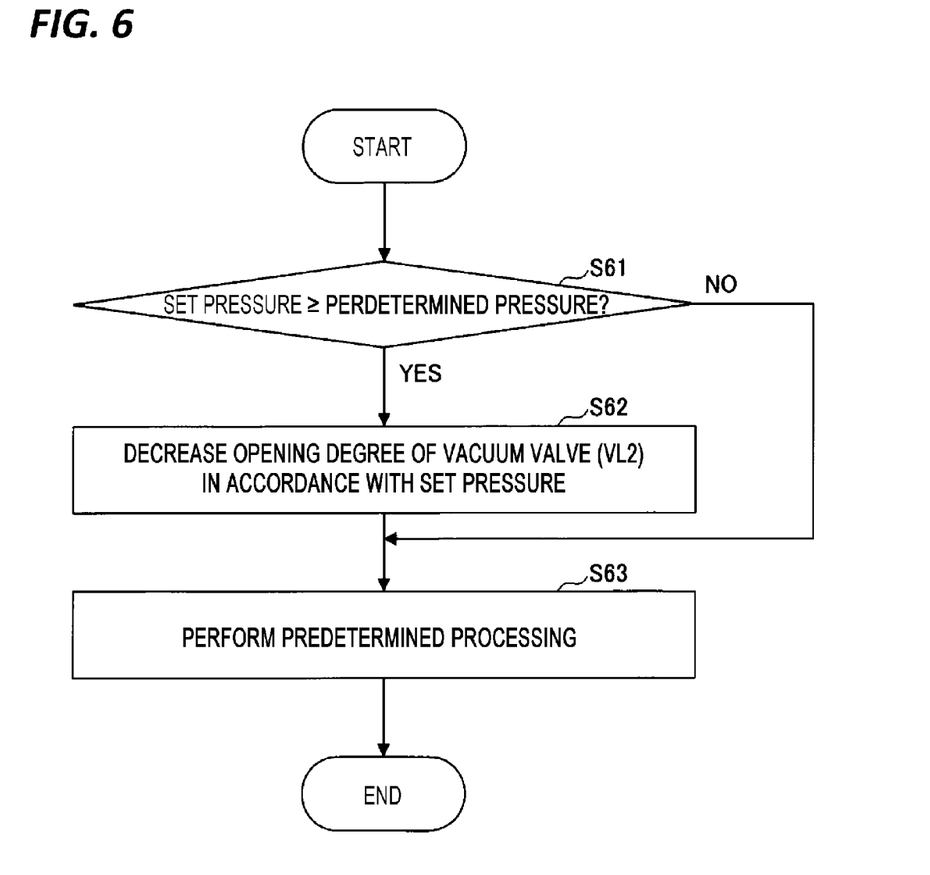
FIG. 6 is a view illustrating an example of a flow of a high-pressure processing.

As an example of an operation (processing method) of the processing apparatus 1, a processing (hereinafter, referred to as a "high-pressure processing") performed by regulating the inside of the processing container 11 to a high-pressure equal to or higher than a predetermined pressure, by controlling an operation of each component of the processing apparatus 1 by the controller 90 will be described with reference to FIG. 6. The high-pressure processing is executed when the controller 90 receives the signal for executing a predetermined processing such as a film forming processing or an etching processing. FIG. 6 is a view illustrating an example of a flow of the high-pressure processing.

In step S61, the controller 90 determines whether the set pressure in a predetermined processing is equal to or higher than a predetermined pressure, based on the received signal for executing the predetermined processing. In step S61, when determining that the set pressure in the predetermined processing is equal to or higher than the predetermined pressure, the controller 90 proceeds the processing to step S62. Meanwhile, in step S61, when determining that the set pressure in the predetermined processing is lower than the predetermined pressure, the controller 90 proceeds the processing to step S63.

In step S62, the controller 90 controls the downstream side vacuum valve VL2 such that the opening degree of the downstream side vacuum valve VL2 is decreased in accordance with the set pressure.

In step S63, the controller 90 causes a predetermined processing to be started by controlling the operation of each component of the processing apparatus 1. After the predetermined processing is ended, the controller 90 causes the high-pressure processing to be ended.

In the above high-pressure processing, when determining that the set pressure in the predetermined processing is equal to or higher than the predetermined pressure, the controller 90 controls the downstream side vacuum valve VL2 such that the opening degree of the downstream side vacuum valve VL2 is decreased in accordance with the set pressure. Therefore, it is possible to suppress the accuracy of pressure control from being decreased, due to the opening degree that becomes too small when performing the pressure control using the upstream side vacuum valve VL1.

However, for example, a case where the set pressure is high when performing the pressure control using the upstream side vacuum valve VL1 is considered. In this case, there is a case where the opening degree of the upstream side vacuum valve VL1 falls below the lower limit value (e.g., 5%) of the usable range. As a result, the inside of the processing container 11 may not be regulated to the set pressure, or the pressure in the processing container 11 may not be stabilized. However, the above problem may be solved in the high-pressure processing described above.

In the embodiment described above, the upstream side vacuum valve VL1 is an example of a first pressure regulator, and the downstream side vacuum valve VL2 is an example of a second pressure regulator. Further, the primary side vacuum gauge VG1 is an example of a first vacuum gauge, and the secondary side vacuum gauge VG3 is an example of a second vacuum gauge.

According to the present disclosure, the machine difference among the processing apparatuses may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An exhaust device comprising:
a first pressure regulator provided in an exhaust pipe connected to a processing container;
a second pressure regulator provided on a downstream side of the first pressure regulator in an exhaust direction in the exhaust pipe;
a first vacuum gauge connected to the exhaust pipe at an upstream side of the first pressure regulator;
a second vacuum gauge connected to the exhaust pipe between the first pressure regulator and the second pressure regulator that are provided in the exhaust pipe; and
a controller configured to control the first pressure regulator and the second pressure regulator,
wherein the exhaust pipe is connected to an exhaust port of the processing container,
each of the first pressure regulator, the second pressure regulator, the first vacuum gauge and the second vacuum gauge is provided at a downstream side of the exhaust port of the processing container where the exhaust port is connected to the exhaust pipe,
the controller regulates the second pressure regulator such that a pressure detected by the second vacuum gauge becomes a predetermined set value,
the controller regulates the second pressure regulator before performing a film formation in the processing container,
the second vacuum gauge is connected to the exhaust pipe via an isolation valve,
the controller closes the isolation valve when performing the film formation in the processing container,
the controller regulates the second pressure regulator in a state where an inert gas is supplied into the processing container, and
the controller is configured to correct a zero point of the first vacuum gauge such that a pressure detected by the first vacuum gauge becomes equal to the pressure detected by the second vacuum gauge after stopping supply of the inert gas into the processing container.

2. The exhaust device according to claim 1, wherein the controller regulates the second pressure regulator in a state where an inside of the processing container is maintained at a constant temperature.

3. The exhaust device according to claim 2, wherein, when controlling a pressure in the processing container to be equal to or higher than a predetermined pressure, the controller regulates the second pressure regulator such that a conductance of the second pressure regulator is reduced, and then regulates the first pressure regulator such that the pressure in the processing container becomes a desired pressure.

4. The exhaust device according to claim 1, wherein, when controlling a pressure in the processing container to be equal to or higher than a predetermined pressure, the controller regulates the second pressure regulator such that conductance of the second pressure regulator is reduced, and then regulates the first pressure regulator such that the pressure in the processing container becomes a desired pressure.

5. A processing system comprising:
a plurality of processing apparatuses each including:
a first pressure regulator provided in an exhaust pipe connected to a processing container;
a first vacuum gauge connected to the exhaust pipe at an upstream side of the first pressure regulator; and
a second pressure regulator provided on a downstream side of the first pressure regulator in an exhaust direction in the exhaust pipe;
a second vacuum gauge connected to the exhaust pipe between the first pressure regulator and the second pressure regulator that are provided in the exhaust pipe; and
a controller configured to regulate the second pressure regulator of each of the plurality of processing apparatus such that a pressure of each of the plurality of processing apparatus detected by the second vacuum gauge become substantially the same as each other,
wherein the exhaust pipe is connected to an exhaust port of the processing container,
each of the first pressure regulator, the second pressure regulator, the first vacuum gauge and the second vacuum gauge is provided at a downstream side of the exhaust port of the processing container where the exhaust port is connected to the exhaust pipe, and
the controller is configured to correct a zero point of the first vacuum gauge such that a pressure detected by the first vacuum gauge becomes equal to a pressure detected by the second vacuum gauge after stopping supply of an inert gas into the processing container.

6. A processing method comprising:
providing a processing apparatus including:
a first pressure regulator provided in an exhaust pipe connected to a processing container;
a first vacuum gauge connected to the exhaust pipe at an upstream side of the first pressure regulator;
a second pressure regulator provided on a downstream side of the first pressure regulator in an exhaust direction in the exhaust pipe; and
a second vacuum gauge connected to the exhaust pipe between the first pressure regulator and the second pressure regulator that are provided in the exhaust pipe,
wherein the exhaust pipe is connected to an exhaust port of the processing container, and
each of the first pressure regulator, the second pressure regulator, the first vacuum gauge and the second vacuum gauge is provided at a downstream side of the exhaust port of the processing container where the exhaust port is connected to the exhaust pipe; and
regulating the second pressure regulator such that a pressure detected by the second vacuum gauge becomes a predetermined set value; and
correcting a zero point of the first vacuum gauge such that a pressure detected by the first vacuum gauge becomes equal to the pressure detected by the second vacuum gauge after stopping supply of an inert gas into the processing container.

7. The processing method according to claim 6, further comprising:
when controlling a pressure in the processing container to be equal to or higher than a predetermined pressure, regulating the second pressure regulator such that a conductance of the second pressure regulator is reduced, and then regulating the first pressure regulator such that the pressure in the processing container becomes a desired pressure.

* * * * *